United States Patent [19]

Okazawa

[11] Patent Number: 4,885,624
[45] Date of Patent: Dec. 5, 1989

[54] STACKED METAL-INSULATOR SEMICONDUCTOR DEVICE

[75] Inventor: Takeshi Okazawa, Tokyo, Japan

[73] Assignee: Nec Corporation, Tokyo, Japan

[21] Appl. No.: 265,193

[22] Filed: Oct. 31, 1988

[30] Foreign Application Priority Data

Oct. 31, 1987 [JP] Japan ................... 62-274728

[51] Int. Cl.[4] .......................... H01L 29/78
[52] U.S. Cl. ...................... 357/42; 357/44; 357/49; 357/4; 357/23.1
[58] Field of Search .......... 357/42, 44, 23.1, 4, 357/49

[56] References Cited

U.S. PATENT DOCUMENTS 4,603,341 7/1986 Bertin .................... 357/23.7

Primary Examiner—Andrew J. James
Assistant Examiner—David L. Soltz
Attorney, Agent, or Firm—Helfgott & Karas

[57] ABSTRACT

A stacked MIS device is comprised of a semiconductor substrate of one conductivity type, a first pair of source and drain regions of the other conductivity type formed in the semiconductor substrate in spaced relation from each other to define therebetween a first channel region, a gate electrode disposed on the first channel region through a gate insulating film so as to extend transversely of the first channel region, a semiconductor film of the conductivity type disposed along the gate electrode through another gate insulating film, and a second pair of source and drain regions of the one conductivity type formed in the semiconductor film in spaced relation from each other to define therebetween a second channel region, the length of second channel region being arranged to intersect with that of the first channel region.

3 Claims, 3 Drawing Sheets

STACKED METAL-INSULATOR SEMICONDUCTOR DEVICE

BACKGROUND OF THE INVENTION

1. Field of the Invention

The present invention relates to semiconductor devices composed of field effect transistors (hereinafter referred to as FET) of metal-insulator semiconductors (hereinafter referred to as MIS) stacked to one another, and more specifically relates to stacked MIS devices composed of a pair of N-type MIS-FET and P-type MIS-FET stacked to each other with a common gate electrode.

2. Description of the Related Art

This type of stacked MIS device has been used in memory cells such as static random access memory (hereinafter referred to as SRAM), which needs high integration density. FIGS. 3(a), 3(b) and 3(c) illustrate one example of the conventional stacked MIS device in which the device is formed of an inverter circuit as shown in FIG. 3(a).

Namely, as indicated in FIG. 3(a), numeral 1 refers to a power terminal held at a potential level of a power supply and numeral 2 refers a grounding terminal held at a grounding potential. A P-type MIS-FET 5 and an N-type MIS-FET 6 are serially connected between the power terminal 1 and the grounding terminal 2. The gate electrodes of those MIS-FET's 5 anc 6 are commonly connected to an input terminal 4. Similarly, their drain electrodes are commonly connected to an output terminal 3. An input signal applied to the input terminal 3 is inverted by the FET's 5 and 6 to be derived at the output terminal 4.

For such inverting operation, the gate electrodes of both FET's 5 and 6 are supplied with the same input signal through the input terminal 3. Therefore, it is better to form the gate electrodes of both FET's 5 and 6 with a single conductive layer having a single region which operates as both gate electrodes. For realizing such gate structure, a stacked MIS device has been devised.

FIG. 3(b) is a schematic plan view of this conventional stacked MIS device, and FIG. 3(c) is a schematic sectional view of the same taken along line D-D of FIG. 3(b). In these figures, an N-type source region 32 and an N-type drain region 33 of the N-type MIS-FET 6 are formed in a P-type semiconductor substrate 31 such as Si. A gate insulating film 34 is formed on the semiconductor substrate 31, between the source and drain regions 32 and 33 and a gate electrode 35 is formed on the gate insulating film 34 to thereby constitute the N-type MIS-FET 6. Further, another gate insulating film 36 is formed on the gate electrode 35 and an N-type semiconductor film 39 such as polycrystalline Si is formed on the gate insulating film 36. Thereafter, a P-type source region 37 and a P-type drain region 38 are formed in the semiconductor film 39 to thereby constitute a P-type MIS-FET 5 together with the aforementioned gate electrode 35.

However, in the above described stacked MIS device of the conventional type, the source and drain regions 32 and 33 of N-type MIS-FET 6 are aligned along the common gate electrode 35 in the same direction as those of source and drain regions 37 and 38 of P-type MIS-FET 5. Therefore, when the channel length of the N-type MIS-FET 6 is to be reduced, the channel length of the P-type MIS-FET 5 is correspondingly needed to be reduced. However, when reducing the dimensions of MIS-FETs in order to increase the integration density of the device, the lower MIS-FET 6 may have different limit in reducing its dimension than that of the upper MIS-FET 5. In such case, the possible reduction of dimension is determined by the critical limit of one MIS-FET which is greater than the dimensional limit of the other MIS-FET. Namely, in such case that the upper P-type MIS-FET 5 is composed of a semiconductor film made of a poly-crystalline silicon or made by re-crystalization of the poly-crystalline silicon, which has a considerable limit in reducing the dimension thereof, the channel length of the lower N-type MIS-FET 6 must be reduced in registration with that of the upper MIS-FET 5.

In order to improve the performance of inverter circuit as shown, for example, in FIG. 3(a), it is needed to reduce the channel length of N-type MIS-FET 6 as small as possible. However, as described above, the possible minimum channel length of N-type MIS-FET 6 is controlled by greater minimum channel length of P-type MIS-FET 5, thereby failing to improve the total performance of device.

SUMMARY OF THE INVENTION

It is a major object of the present invention to provide a stacked MIS device in which the channel length of lower MIS-FET can be controlled without regard to the channel length of upper MIS-FET.

According to the present invention, the stacked MIS device is comprised of a semiconductor substrate of one conductivity type, first source and drain regions of the other conductivity type formed in the semiconductor substrate so as to be aligned in a first direction, a first gate insulating film formed on the semiconductor substrate between the first source and drain regions, a gate electrode formed on the gate insulating film, a second gate insulating film formed on the gate electrode, a semiconductor film of the other conductivity type formed on the second gate insulating film, and second source and drain regions of the one conductivity type formed in the semiconductor film so as to be aligned in a second direction orthogonal to the first direction. The lengthwise direction of channel between the first source and drain regions, that is, the first direction, is arranged orthogonal to the lengthwise direction of channel between the second source and drain regions, that is, the second direction. Thus, the channel length of the one MIS-FET positioning on lower side can be reduced without regard to that of the other MIS-FET positioning on upper side.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1A:
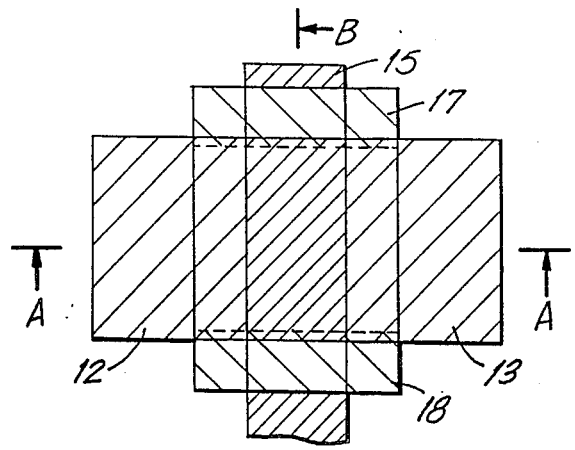
FIG. 1(a) is a schematic plan view of a stacked MIS devices according to a first preferred embodiment of the present invention.
Figure 1B:
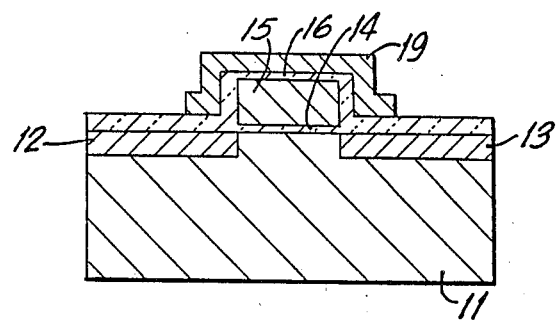
FIG. 1(b) is a schematic sectional view taken along line A—A of FIG. 1(a)
Figure 1C:
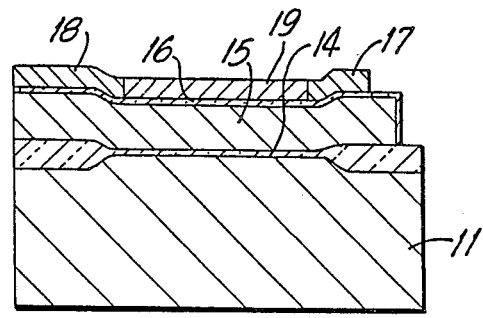
FIG. 1(c) is a schematic sectional view taken along line B—B of FIG. 1(a)

The present invention will be explained in detail in conjunction with the attached drawings. FIGS. 1(a) to 1(c) show the first preferred embodiment of the present invention In these figures, a first N-type source region 12 and a first N-type drain region 13 are formed in a P-type semiconductor substrate 11 of Si in spaced relation to define therebetween a channel region. A first gate insulating film 14 is formed over the first source and drain regions 12 and 13. A gate electrode 15 is formed on the gate insulating film 14 and extends widthwise of the channel region to cover the channel region to thereby constitute an N-type MIS-FET. Further, a second gate insulating film 16 is formed on the gate electrode 15, and an N-type semiconductor film 19 is formed on the second gate insulating film 16 and extends along the gate electrode 15. The semiconductor film 19 is made of poly-crystalline silicon, made by recrystalization of the poly-crystalline silicon or made of amorphous Si A second P-type source region 17 and a P-type drain region 18 are formed in the semiconductor film 19 in opposed relation relative to the channel region of the lower N-type MIS-FET to thereby constitute together with the common gate electrode 15 a P-type MIS-FET which is stacked on the lower N-type MIS-FET. In such structure, the P-type source and drain regions 17 and 18 are aligned in the direction orthogonal to the directiOn alOng which the first N-type source and drain regions 12 and 13 are aligned. Namely, lengthwise direction of the N-type MIS-FET orthogonally intersects that of the P-type MIS-FET.

Figure 3A:
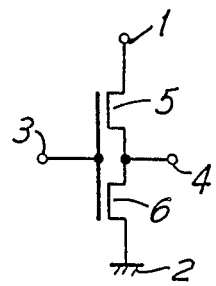
FIG. 3(a) is a circuit diagram of an inverter using P- and N-type MIS FET's.
Figure 3B:
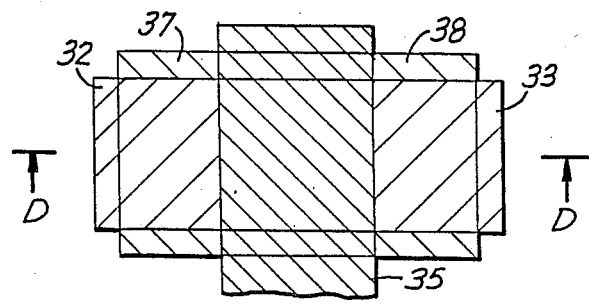
FIG. 3(b) is a schematic plan view of a conventional stacked MIS device.
Figure 3C:
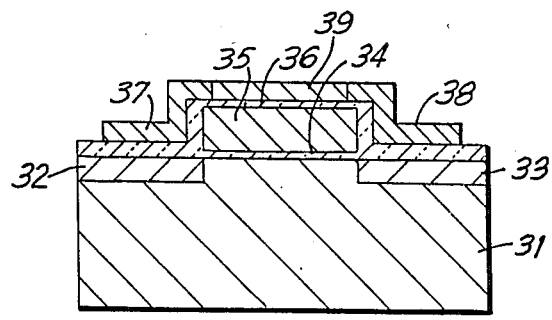
FIG. 3(c) is a schematic sectional view taken along line D—D of FIG. 3(b).

According to the above described structure, the channel length of upper P-type MIS-FET can be set without regard to the width of gate electrode 15. Stated otherwise, the width of gate electrode 15 can be reduced to minimize the channel length of the lower N-type MIS-FET, even when the reduction of the channel length of the upper P-type MIS-FET is limited Therefore, for example, in constructing the inverter circuit as shown in FIG. 3(a), the channel length of N-type MIS-FET can be freely designed to thereby easily obtain high performance of the inverter circuit.

Further, according to such construction, the channel length of lower N-type MIS-FET corresponds as it is to the channel width of upper P-type MIS-FET (which means a width of the source and drain regions 17 and 18 of P-type MIS-FET, and which is perpendicular to the direction of current flow in operation). Therefore, the reduction of the N-type channel length of MIS-FET may affect the performance of P-type MIS-FET such as withstanding voltage characteristic. In return, leak current of the P-type MIS-FET can be reduced. Consequently, when this type of stacked MIS-FET is applied to SRAM circuit, the reduction of leak current, which is more significant factor than degradation of the P-type MIS-FET performance, can be achieved to benefit the design of this type of circuit.

Figure 2A:
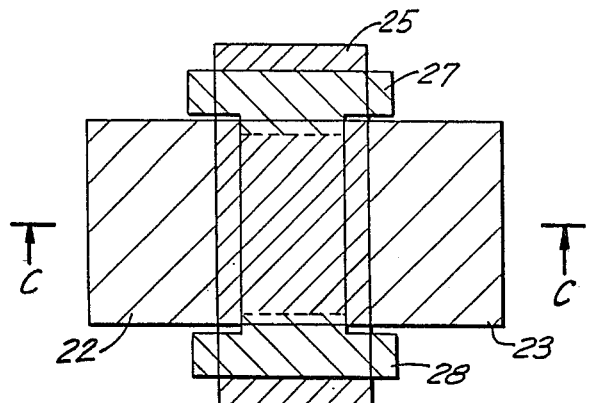
FIG. 2(a) is a schematic plan view of a stacked MIS device according to a second preferred embodiment of the present invention.
Figure 2B:
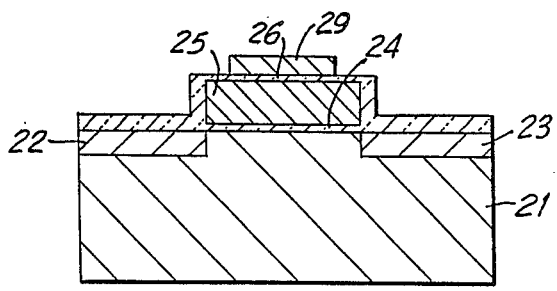
FIG. 2(b) is a schematic sectional view taken along line C—C of FIG. 2(a)

FIGS. 2(a) and 2(b) show another embodiment of the present invention In this embodiment, source region 22 and drain region 23 of N-type MIS-FET are formed in a semiconductor substrate 21 A gate electrode 25 is disposed on a channel between the source region 22 and drain region 23 through a gate insulating film 24, and extends transversely of the channel. A semiconductor film 29 is formed along the gate electrode 25 on another gate insulating film 26 which covers the gate electrode 25. Another pair of source and drain regions 27 and 28 of P-type MIS-FET transistor are formed in the semiconductor film 29 in spaced relation from each other in the direction transverse to the channel between the source and drain regions 22 and 23. In addition, the semiconductor film 29 is formed into "I"-shape so as to avoid the source and drain regions 27 and 28 of P-type MIS-FET transistor from overlapping with the source and drain regions 22 and 23 of N-type MIS-FET transistor. Namely, the source and drain regions 27 and 28 are formed in the opposite end portions of I-shape semiconductor film 29.

In this embodiment, the channel length of lower N-type MIS-FET transistor is not reduced to its minimum. In return, since the source and drain regions of upper P-type MIS-FET do not overlap with the source and drain regions of lower N-type MIS-FET transistor, respectively, the electrostatic capacitance is eliminated between the upper source and drain regions 27 and 28 and the lower source and drain regions 22 and 23.

As described above, according to the present invention, the length of channel between the source and drain regions of one conductive type MIS-FET formed on a semiconductor substrate is arranged orthogonally to the length of channel between the source and drain regions of the opposite conductive type MIS-FET transistor formed in a semiconductor film disposed on the one conductive type MIS-FET. Therefore, the respective channel lengths of the one conductive type MIS-FET and the opposite conductive type MIS-FET are set independently of one another. Particularly, the channel length of the one conductive type MIS-FET can be minimized to obtain the optimum circuit design.

What is claimed is:

1. An MIS device of the stacked type comprising: a semiconductor substrate of one conductivity type; a first pair of source and drain regions of the other conductivity type formed in the semiconductor substrate in spaced relation from each other to define therebetween a first channel region; a first gate insulating film disposed over said first channel region; a gate electrode disposed on said first channel region through said first gate insulating film and extending transversely of said first channel region so as to constitute together with said first pair of source and drain regions one conductive type MIS-FET transistor; a second gate insulating film disposed over said gate electrode; a semiconductor film of said other conductivity type disposed along said gate electrode through said second gate insulating film, said semiconductor film being formed into I-shape; and a second pair of source and drain regions of said one conductivity type formed in the respective end portions of said I-shape of said semiconductor film in spaced relation from each other to define therebetween a second channel region to constitute together with said gate electrode the opposite conductive type MIS-FET transistor such that the length of said second channel region is arranged to intersect with that of said first channel region and said second pair of source and drain regions is prevented from overlapping with said first pair of source and drain regions by said I-shape of said semiconductor film.

2. An MIS device according to claim 1, wherein said semiconductor film is composed of poly-crystalline silicon.

3. An MIS device according to claim 1, wherein said semiconductor film is composed of recrystalized silicon.

* * * * *